US 12,300,544 B2

(12) United States Patent
Zhao et al.

(10) Patent No.: US 12,300,544 B2
(45) Date of Patent: May 13, 2025

(54) EXPANDING METHOD AND EXPANDING APPARATUS

(71) Applicant: DISCO CORPORATION, Tokyo (JP)

(72) Inventors: Jinyan Zhao, Tokyo (JP); Takayuki Masada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 416 days.

(21) Appl. No.: 16/923,591

(22) Filed: Jul. 8, 2020

(65) Prior Publication Data

US 2021/0028063 A1 Jan. 28, 2021

(30) Foreign Application Priority Data

Jul. 22, 2019 (JP) ................................. 2019-134929

(51) Int. Cl.
*H01L 21/78* (2006.01)
*H01L 21/67* (2006.01)
*H01L 21/683* (2006.01)

(52) U.S. Cl.
CPC ........ *H01L 21/78* (2013.01); *H01L 21/67092* (2013.01); *H01L 21/67132* (2013.01); *H01L 21/6836* (2013.01); *H01L 2221/68336* (2013.01)

(58) Field of Classification Search
None
See application file for complete search history.

(56) References Cited

U.S. PATENT DOCUMENTS

| 2018/0197776 A1* | 7/2018 | Ban ..................... H01L 23/3135 |
| 2018/0350651 A1* | 12/2018 | Zhao .................. H01L 21/6875 |
| 2018/0358256 A1* | 12/2018 | Ueki .................. H01L 21/6836 |
| 2019/0279903 A1* | 9/2019 | Zhao ...................... H01L 21/78 |

FOREIGN PATENT DOCUMENTS

| CN | 110034045 A | 7/2019 |
| JP | 2010206136 A | 9/2010 |
| JP | 2013191718 A | 9/2013 |
| JP | 2013239557 A | 11/2013 |
| JP | 2014063953 A * | 4/2014 |

(Continued)

OTHER PUBLICATIONS

English translation of JP-2014063953-A (Year: 2014).*

(Continued)

*Primary Examiner* — Erik T. K. Peterson
(74) *Attorney, Agent, or Firm* — Greer, Burns & Crain, Ltd

(57) ABSTRACT

An expanding method includes a frame securing step of securing an annular frame of a workpiece unit with frame securing means, an expanding step of, after the frame securing step, pressing a portion of an expandable sheet that lies between an outer circumferential edge of the workpiece and an inner circumferential edge of the annular frame, with an expanding drum to expand the expandable sheet, and a heating step of, after the expanding step, heating and shrinking a slackening portion of the expandable sheet which has been formed by expansion of the expandable sheet. The heating step includes a fully circumferential heating step of heating a full outer circumferential portion of the workpiece and an additional heating step of additionally heating a local area of the full outer circumferential portion of the workpiece.

7 Claims, 13 Drawing Sheets

(56) References Cited

FOREIGN PATENT DOCUMENTS

JP         2017059765 A   *   3/2017   ........... H01L 21/304
KR     1020180036661 A      4/2018

OTHER PUBLICATIONS

Machine translation of JP 2017-59765 A (Year: 2017).*
Japanese Patent Application 2019-134929: English translation of Office Action, Apr. 4, 2023, (3 pages).
Office Action issued in corresponding Korean Patent Application No. 10-2020-0073387, mailed Oct. 14, 2024.
Chinese Patent Application 202010704482.4: English translation of Office Action, Feb. 23, 2025, (8 pages).

* cited by examiner

EXPANDING METHOD AND EXPANDING APPARATUS

BACKGROUND OF THE INVENTION

Field of the Invention

The present invention relates to an expanding method and an expanding apparatus for expanding an expandable sheet of a workpiece unit that includes a workpiece, the expandable sheet affixed to the workpiece, and an annular frame to which an outer circumferential portion of the expandable sheet is affixed.

Description of the Related Art

There has been used in the art an expanding apparatus that expands an expandable sheet affixed to a workpiece having modified layers formed therein by a laser beam applied thereto or a workpiece having laser-processed grooves or cut grooves defined therein, to divide the workpiece into individual device chips (see, for example, JP 2010-206136A).

When an expandable sheet is expanded by the expanding apparatus disclosed in JP 2010-206136A, however, the portion of the expandable sheet that lies between the outer circumferential edge of the workpiece and the inner circumferential edge of an annular frame to which an outer circumferential portion of the expandable sheet is affixed may slacken, tending to allow adjacent device chips to collide and damage each other. To avoid such difficulty, the expanding apparatus disclosed in JP 2010-206136A includes a heater for heating and shrinking the portion of the expandable sheet that lies between the outer circumferential edge of the workpiece and the inner circumferential edge of the annular frame.

SUMMARY OF THE INVENTION

The applicant of the present invention has found that an expandable sheet wound in a roll shrinks to different degrees in different directions, i.e., a widthwise direction transverse to the expandable sheet and an expandable direction in which the expandable sheet is expandable. Therefore, when the portion of the expandable sheet that lies between the outer circumferential edge of the workpiece and the inner circumferential edge of the annular frame is uniformly heated by the heater of the expanding apparatus disclosed in JP 2010-206136A, the portion of the expandable sheet is not sufficiently shrunk in the expandable direction, and hence, tends to fail to develop enough spaces between adjacent device chips of the divided workpiece after being expanded, with the result that the device chips may possibly collide and damage each other.

It is therefore an object of the present invention to provide an expanding method and an expanding apparatus that are capable of preventing device chips of a divided workpiece from colliding and damaging each other.

In accordance with an aspect of the present invention, there is provided an expanding method of expanding an expandable sheet of a workpiece unit that includes a workpiece, the expandable sheet affixed to the workpiece, and an annular frame to which an outer circumferential portion of the expandable sheet is affixed, including the steps of securing the annular frame of the workpiece unit with frame securing means, after the step of securing the annular frame, pressing a portion of the expandable sheet that lies between an outer circumferential edge of the workpiece and an inner circumferential edge of the annular frame, with pressing means to expand the expandable sheet, and after the step of pressing the portion of the expandable sheet to expand the expandable sheet, heating and shrinking a slackening portion of the expandable sheet which has been formed by expansion of the expandable sheet. In the expanding method, the step of heating and shrinking the slackening portion of the expandable sheet includes the steps of heating a full outer circumferential portion of the workpiece and additionally heating a local area of the full outer circumferential portion of the workpiece.

Preferably, the expandable sheet of the workpiece unit is cut off from an expandable sheet web having a constant width, the widthwise directions of the expandable sheet web are referred to as first directions, the longitudinal directions of the expandable sheet web are referred to as second directions which are perpendicular to the first directions, and the step of heating and shrinking the slackening portion of the expandable sheet includes the step of heating both areas of the slackening portion outside of the workpiece in the second directions.

In accordance with another aspect of the present invention, there is provided an expanding apparatus for expanding an expandable sheet of a workpiece unit that includes a workpiece, the expandable sheet affixed to the workpiece, and an annular frame to which an outer circumferential portion of the expandable sheet is affixed, including frame securing means for securing the annular frame of the workpiece unit, pressing means for pressing a portion of the expandable sheet that lies between an outer circumferential edge of the workpiece and an inner circumferential edge of the annular frame to expand the expandable sheet, heating means for heating and shrinking a slackening portion of the expandable sheet which has been formed by expansion of the expandable sheet, and a control unit for controlling at least the heating means. In the expanding apparatus, the heating means includes a first heater and a second heater disposed on a circle aligned with an annular region of the expandable sheet between the inner circumferential edge of the annular frame and the workpiece, for facing the annular region of the expandable sheet, and rotating means for rotating the first heater and the second heater about a rotational axis passing through the center of the circle, and the control unit stops one of the first heater and the second heater from heating the annular region of the expandable sheet while the first heater and the second heater are being rotated by the rotating means.

Preferably, the expandable sheet of the workpiece unit is cut off from an expandable sheet web having a constant width, the widthwise directions of the expandable sheet web are referred to as first directions, the longitudinal directions of the expandable sheet web are referred to as second directions which are perpendicular to the first directions, and the control unit stops one of the first heater and the second heater which faces both end areas of the expandable sheet in the first directions from heating the annular region of the expandable sheet while the first heater and the second heater are being rotated by the rotating means.

The present invention is advantageous in that device chips into which the workpiece is to be divided and which remains on the expandable sheet are restrained from colliding and damaging each other.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described in detail below with reference to the drawings. The present invention is not limited to the details of the embodiment described below. The components described below cover those which could easily be anticipated by those skilled in the art and those which are essentially identical thereto. Moreover, the arrangements described below can be used in appropriate combinations. Various omissions, replacements, or changes of the arrangements may be made without departing from the scope of the present invention.

Figure 1:
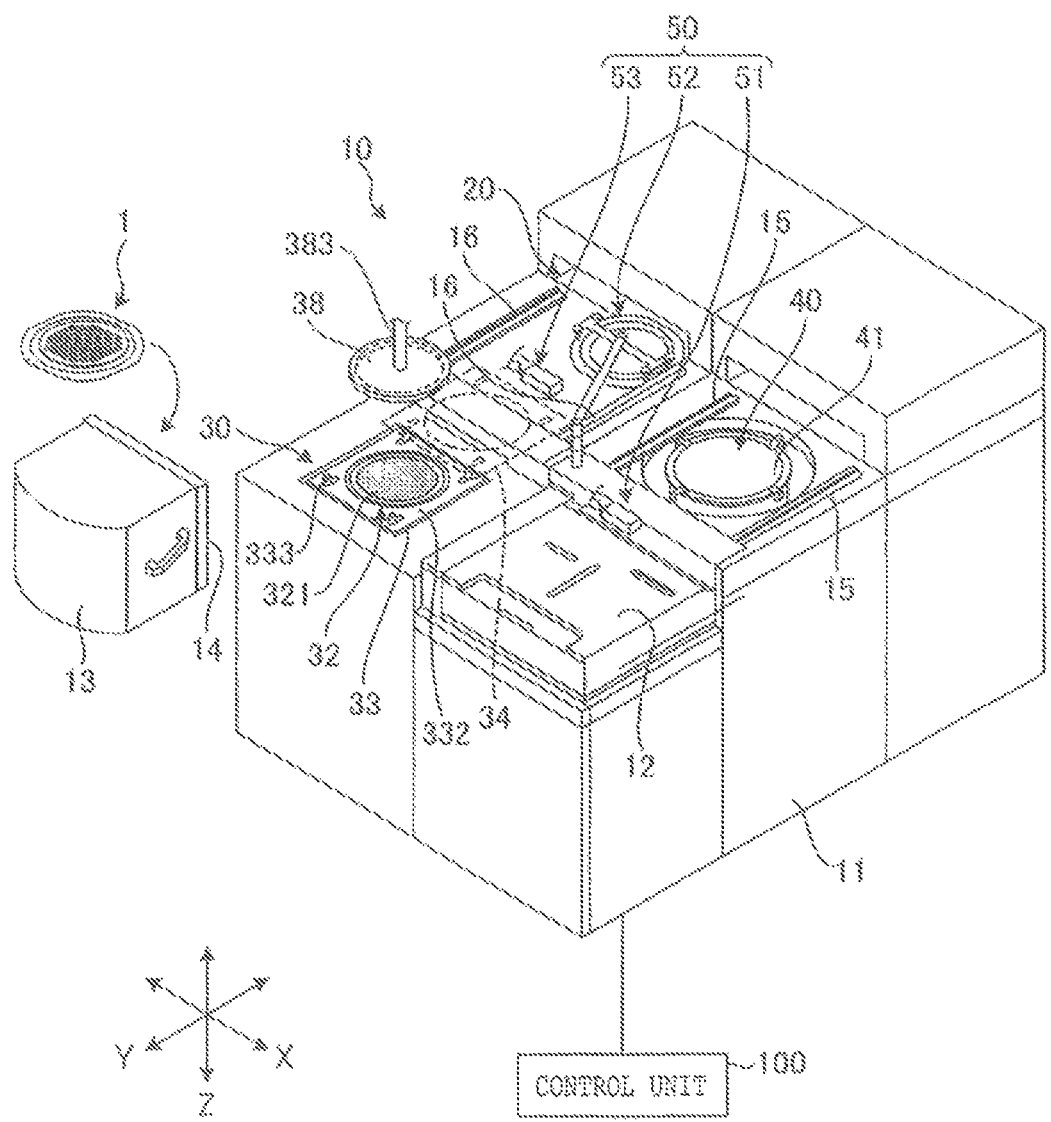
FIG. 1 is a perspective view illustrating a structural example of an expanding apparatus according to an embodiment of the present invention.
Figure 2:
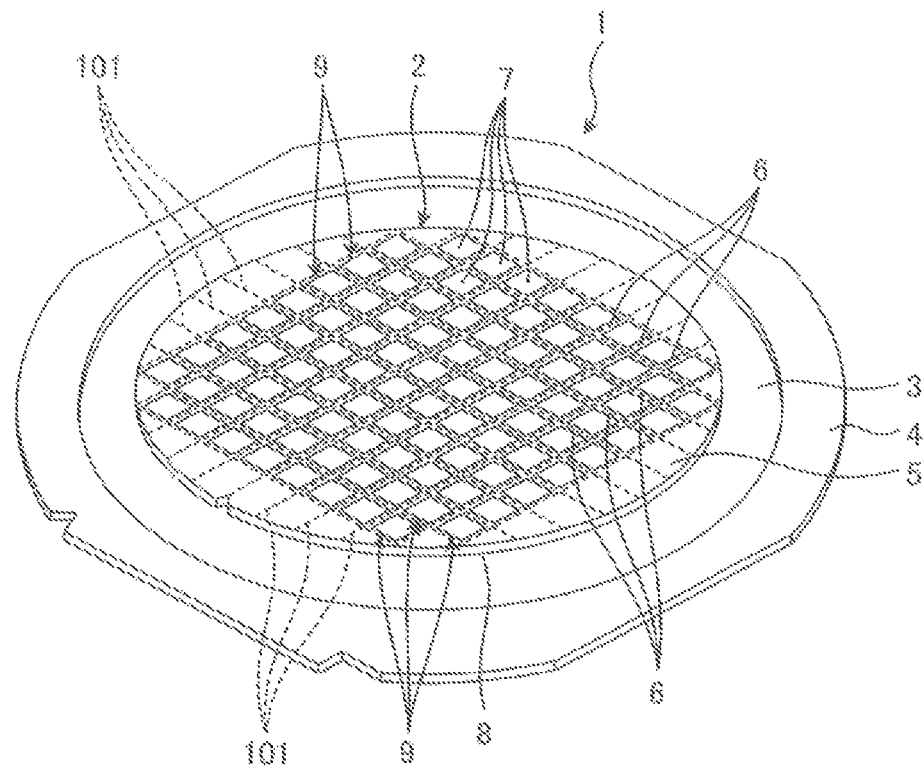
FIG. 2 is a perspective view illustrating an example of a workpiece unit as an object to be processed by the expanding apparatus according to the embodiment.

An expanding apparatus, denoted by 10 in FIG. 1, according to the present embodiment is an apparatus for expanding an expandable sheet 3 of a workpiece unit 1 illustrated in FIG. 2. As illustrated in FIG. 2, the workpiece unit 1 includes a workpiece 2, the expandable sheet 3 that is affixed to the workpiece 2, and an annular frame 4 that is of a circular ring shape having an inside diameter larger than the outside diameter of the workpiece 2. The expandable sheet 3 has an outer circumferential portion affixed to the annular frame 4.

According to the present embodiment, the workpiece 2 is a wafer such as a semiconductor wafer or an optical wafer in the form of a circular plate including a substrate of silicon, sapphire, gallium arsenide, silicon carbide (SiC), or the like. As illustrated in FIG. 2, the workpiece 2 has a plurality of devices 7 fabricated in respective areas demarcated on a face side 5 thereof by a plurality of intersecting projected dicing lines 6. The workpiece 2 has a reverse side 8 opposite the face side 5 with an expandable sheet 3 affixed to the reverse side 8. An annular frame 4 is affixed to an outer circumferential portion of the expandable sheet 3. The workpiece 2 has modified layers 101, indicated by the dotted lines in FIG. 2, that are formed as division initiating points within the substrate along the projected dicing lines 6 by a laser beam having a wavelength that is transmittable through the substrate and applied to the workpiece 2 from the reverse side 8 along the projected dicing lines 6.

The modified layers 101 refer to regions having a density, a refractive index, a mechanical strength, or other physical properties different from those of regions around the modified layers 101. For example, the modified layers 101 may refer to melted regions, cracked regions, breakdown regions, regions having a varied refractive index, or regions including those regions mixed together.

The expandable sheet 3 is made of a stretchable resin and is thermally shrinkable such that it shrinks when heated. The expandable sheet 3 is shaped as a circular plate larger in diameter than the workpiece 2. The expandable sheet 3 includes a base layer made of a synthetic resin that is stretchable and thermally shrinkable and an adhesive layer stacked on the base layer and affixed to the workpiece 2, the adhesive layer being made of a synthetic resin that is stretchable and thermally shrinkable.

Figure 3:
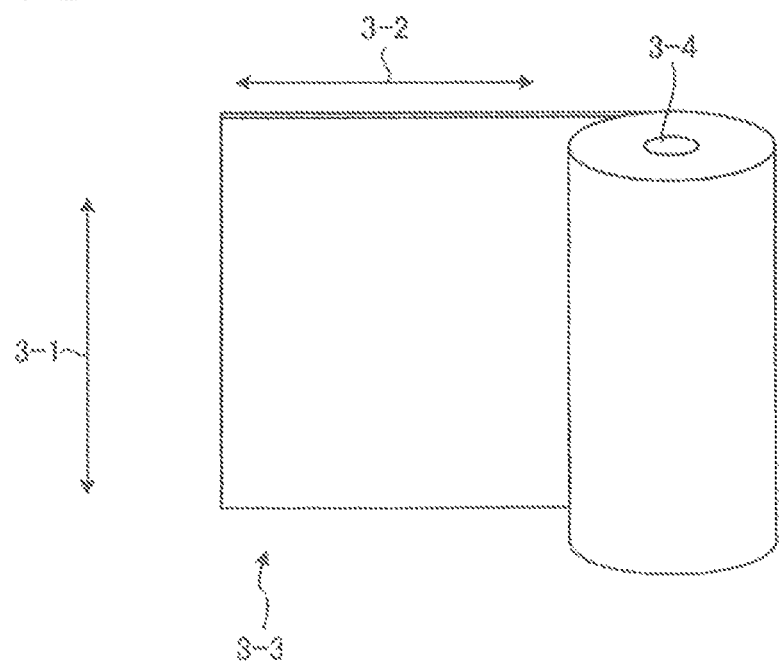
FIG. 3 is a perspective view illustrating a structural example of an expandable sheet web from which an expandable sheet can be cut off as part of the workpiece unit illustrated in FIG. 2.

The expandable sheet 3 is cut off as a circular expandable sheet from an expandable sheet web 3-3 illustrated in FIG. 3. The expandable sheet web 3-3 is an elongate expandable sheet having a constant width which is wound as a roll around a core 3-4. According to the present embodiment, the widthwise directions of the expandable sheet web 3-3 are referred to as first directions 3-1 and the longitudinal directions of the expandable sheet web 3-3 are referred to as second directions 3-2, which are perpendicular to the first directions 3-1. The expandable sheet web 3-3 is less liable to shrink thermally in the second directions 3-2 than in the first directions 3-1. In other words, when the expandable sheet web 3-3 is heated, the dimension by which it shrinks in the second directions 3-2 is smaller than the dimension by which it shrinks in the first directions 3-1.

The first directions 3-1 are also referred to as transverse directions (TD), whereas the second directions 3-2 as machine directions (MD). The expandable sheet web 3-3 is manufactured by moving a heated resin in one of the second directions 3-2, elongating the resin in the second directions 3-2 and the first directions 3-1, and winding the elongate resin into a roll around the core 3-4. The expandable sheet web 3-3 has its adhesive layer covered with an unillustrated peel-off sheet. The peel-off sheet that covers the adhesive layer protects the adhesive layer. When the expandable sheet web 3-3 is wound around the core 3-4, the peel-off sheet is positioned radially inwardly of the base layer. In FIG. 3, the peel-off layer is omitted from illustration.

The expanding apparatus 10 illustrated in FIG. 1 is also an apparatus for dividing the workpiece 2 with the modified layers 101 formed as division initiating points therein, along the projected dicing lines 6 into individual device chips 9 (see FIG. 2). Each of the device chips 9 includes a portion of the substrate divided along the projected dicing lines 6 and one of the devices 7 formed on a surface of the substrate. As illustrated in FIG. 1, the expanding apparatus 10 includes a cassette elevator 12, an expanding unit 20, a heating unit 30, a cleaning unit 40, and a delivery unit 50, all disposed on an apparatus body 11, and a control unit 100 for controlling these components or units.

The cassette elevator 12 is disposed on an end of the apparatus body 11 in one of Y-axis directions parallel to horizontal directions. A cassette 13 for housing a plurality of workpiece units 1 therein is removably placed on the cassette elevator 12. The cassette 13 houses the workpiece units 1 at spaced intervals in Z-axis directions parallel to vertical directions. The cassette 13 placed on the cassette elevator 12 has an opening 14 defined in a vertical side wall thereof that is open toward a central area of the apparatus body 11 along the Y-axis directions. The cassette elevator 12 lifts and lowers the cassette 13 placed thereon in the Z-axis directions.

The expanding apparatus 10 also includes a pair of first guide rails 15 for temporarily placing thereon a workpiece unit 1 taken out of or to be taken into the cassette 13 and a pair of second guide rails 16. The first guide rails 15 extend parallel to the Y-axis directions and are spaced a distance from each other in X-axis directions parallel to horizontal directions and perpendicular to the Y-axis directions. The first guide rails 15 are disposed on the central area of the apparatus body 11 in the Y-axis directions in alignment, in the Y-axis directions, with the respective ends of the opening 14 of the cassette 13 that are spaced from each other along the X-axis directions. The first guide rails 15 are movable toward and away from each other in the X-axis directions by an unillustrated drive mechanism. A workpiece unit 1 taken out of or to be taken into the cassette 13 is placed on the first guide rails 15 and is positioned in the X-axis directions by the first guide rails 15 when they are moved toward each other by the drive mechanism.

The second guide rails 16 support a workpiece unit 1 or the like temporarily placed thereon that has been delivered from the first guide rails 15 by the delivery unit 50. The second guide rails 16 extend parallel to the Y-axis directions and horizontal directions and are spaced a distance from each other in the X-axis directions. The second guide rails 16 are disposed on the central area of the apparatus body 11 in the Y-axis directions and adjacent to the first guide rails 15 in the X-axis directions. The second guide rails 16 are movable toward and away from each other in the X-axis directions by an unillustrated drive mechanism. A workpiece unit 1 transported from the first guide rails 15 is placed on the pair of second guide rails 16 and is positioned in the X-axis directions by the second guide rails 16 when they are moved toward each other by the drive mechanism.

The delivery unit 50 includes a first delivery unit 51 for delivering a workpiece unit 1 between the cassette 13 and the first guide rails 15, a second delivery unit 52 for delivering a workpiece unit 1 between the first guide rails 15 and the second guide rails 16 and also delivering a workpiece unit 1 between the second guide rails 16 and the heating unit 30, and a third delivery unit 53 for delivering a workpiece unit 1 between the second guide rails 16 and the expanding unit 20.

Figure 4:
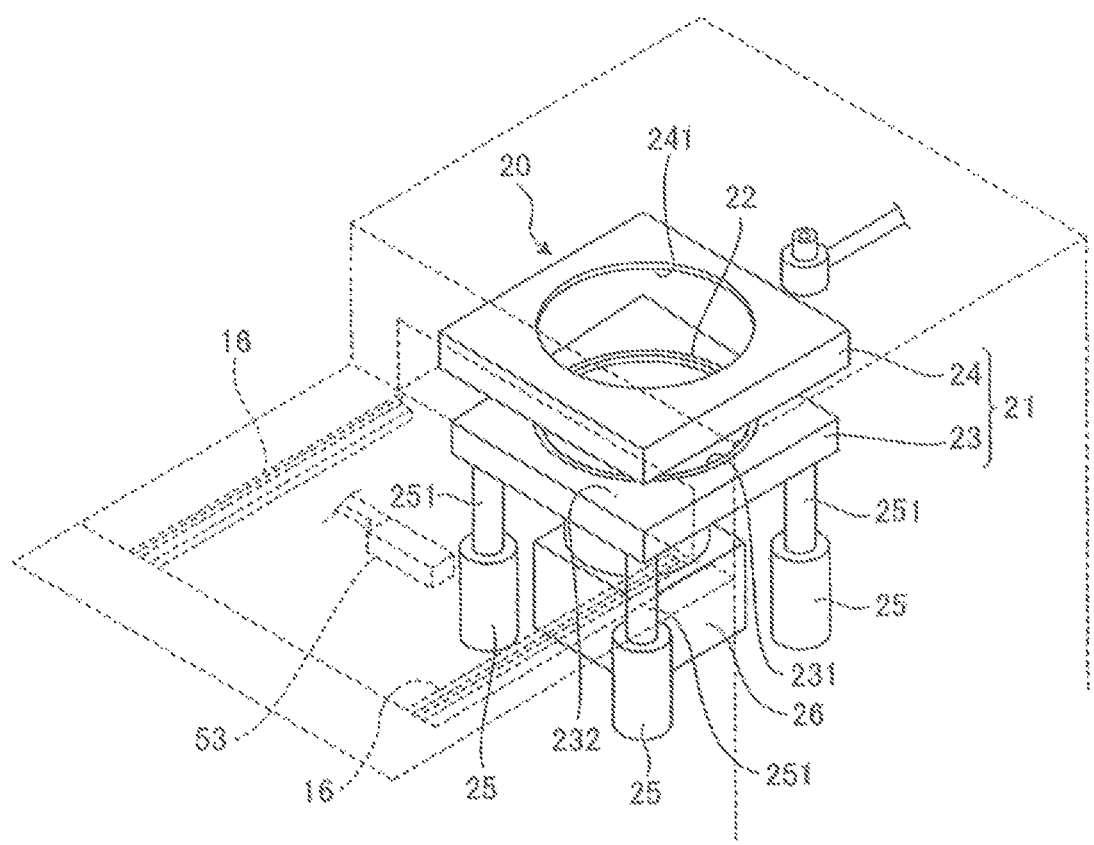
FIG. 4 is a perspective view of an expanding unit of the expanding apparatus illustrated in FIG. 1.

The expanding unit 20 is disposed next to one side of the pair of second guide rails 16 in the Y-axis directions. As illustrated in FIG. 4, the expanding unit 20 includes a frame securing assembly 21 as frame securing means and an expanding drum 22 as pressing means. The frame securing assembly 21 functions to secure the annular frame 4 of a workpiece unit 1.

The frame securing assembly 21 includes a frame rest plate 23 and a frame pressing plate 24. The frame rest plate 23 has an opening 231 defined therein that is circular in shape as viewed in plan and is of a plate shape having an upper surface 232 lying flatwise parallel to horizontal directions. The opening 231 defined in the frame rest plate 23 has a diameter equal to the inside diameter of the annular frame 4. The annular frame 4 around a workpiece 2 is placed on the upper surface 232 of the frame rest plate 23 while the workpiece 2 is being positioned over the opening 231. According to the present embodiment, the frame rest plate 23 is lifted in one of the Z-axis directions by cylinders 25 from a position in which the upper surface 232 of the frame rest plate 23 lies flush with the lower surface of the annular frame 4 of the workpiece unit 1 that is positioned in the X-axis directions by the second guide rails 16.

The frame rest plate 23 is mounted on upper distal ends of extendable and contractible piston rods 251 of the respective cylinders 25. When the piston rods 251 are extended and contracted, the frame rest plate 23 is lifted and lowered in the Z-axis directions.

The frame pressing plate 24 is fixed in place above the frame rest plate 23. The frame pressing plate 24 is shaped as a plate whose dimensions are almost the same as the dimensions of the frame rest plate 23 and has a circular opening 241 defined centrally therein that is dimensionally identical to the opening 231. The opening 241 defined in the frame pressing plate 24 is coaxial with the opening 231 in the frame rest plate 23.

When the piston rods 251 of the cylinders 25 are contracted, the frame rest plate 23 of the frame securing assembly 21 is lowered into a low position, and then a workpiece unit 1 is delivered onto the upper surface 232 of the frame rest plate 23 by the third delivery unit 53. After the annular frame 4 of the workpiece unit 1 has been placed on the upper surface 232 of the frame rest plate 23, the piston rods 251 of the cylinders 25 are extended to lift the frame rest plate 23 until the annular frame 4 of the workpiece unit 1 is sandwiched and secured between the frame pressing plate 24 and the lifted frame rest plate 23.

The expanding drum 22 expands the expandable sheet 3 by pressing the portion of the expandable sheet 3 that lies between the outer circumferential edge of the workpiece 2 and the inner circumferential edge of the annular frame 4 that has been secured by the frame securing assembly 21. The expanding drum 22 is of a hollow cylindrical shape having an outside diameter that is smaller than the inside diameter of the annular frame 4 placed on the upper surface 232 of the frame rest plate 23 but larger than the outside diameter of the workpiece 2 affixed to the expandable sheet 3. The expanding drum 22 is disposed coaxially with the openings 231 and 241 of the frame securing assembly 21. Rollers 221 (see FIG. 7, etc.) are rotatably mounted on the upper end of the expanding drum 22.

The expanding drum 22 is mounted on a cylinder 26 and can be lifted and lowered in the Z-axis directions by the cylinder 26. According to the present embodiment, the expanding drum 22 is vertically movable in the Z-axis directions by the cylinder 26 between a position in which the rollers 221 are positioned below the upper surface 232 of the frame rest plate 23 of the frame securing assembly 21 that has secured the annular frame 4 and a position in which the rollers 221 are positioned above the upper surface 232 of the frame rest plate 23 of the frame securing assembly 21 that has secured the annular frame 4.

The expanding unit 20 expands the expandable sheet 3 in planar directions by securing the annular frame 4 of the workpiece unit 1 with the frame securing assembly 21 and lifting the expanding drum 22 from the lower position in which the rollers 221 are positioned below the upper surface 232 of the frame rest plate 23 of the frame securing assembly 21 that has secured the annular frame 4, thereby pressing the portion of the expandable sheet 3 that lies between the outer circumferential edge of the workpiece 2 and the inner circumferential edge of the annular frame 4. After having temporarily expanded the expandable sheet 3, the expanding unit 20 forms a slackening portion 3-5 (see FIG. 10, etc.) in an annular region 102 of the expandable sheet 3 between the outer circumferential edge of the workpiece 2 and the inner circumferential edge of the annular frame 4 by lowering the expanding drum 22.

Figure 5:
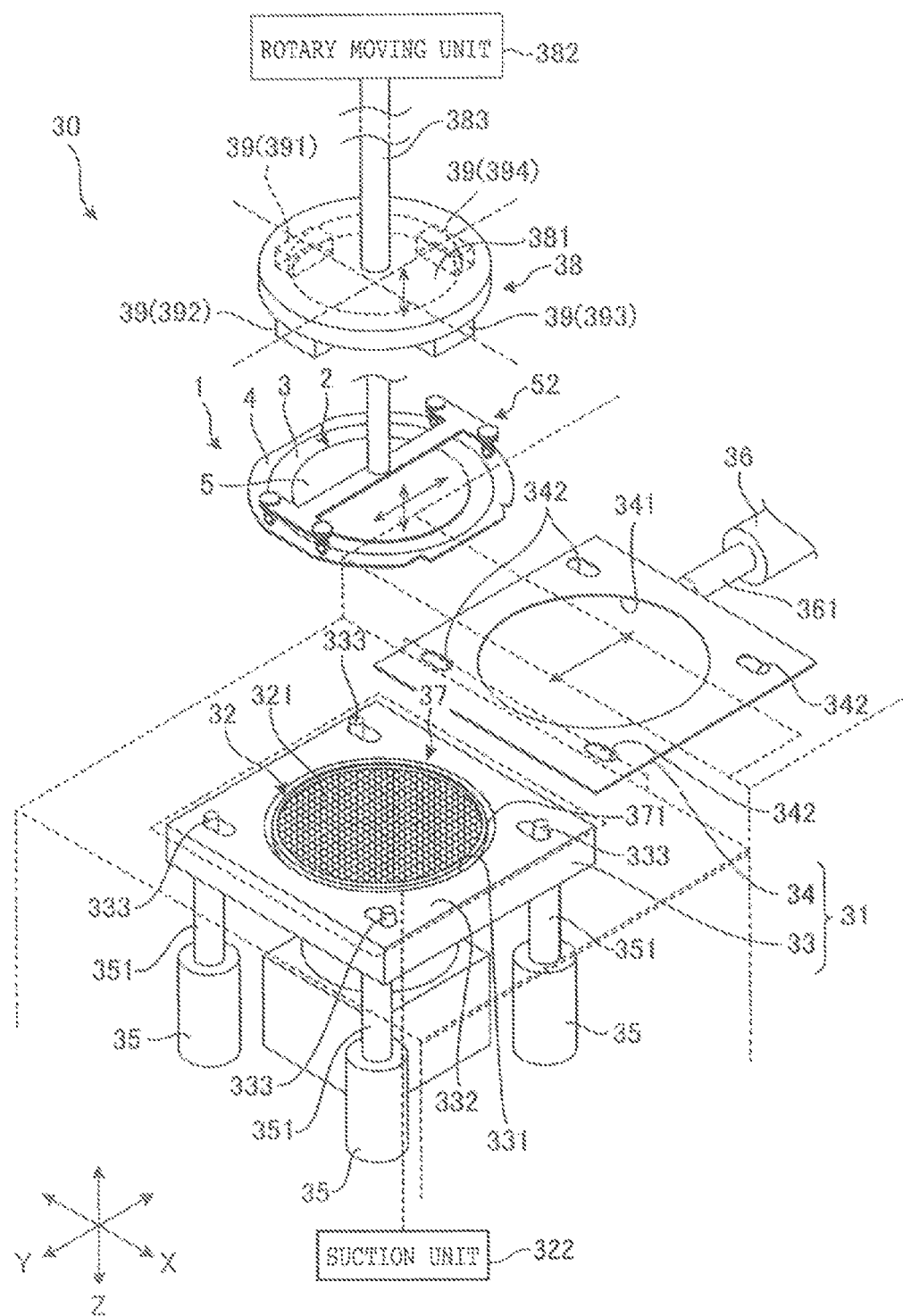
FIG. 5 is a perspective view of a heating unit of the expanding apparatus illustrated in FIG. 1.

The heating unit 30 is disposed next to the other side of the pair of second guide rails 16 in the Y-axis directions. As illustrated in FIG. 5, the heating unit 30 includes a holding table 32, a frame securing assembly 31, a sheet expanding unit 37, and heating means 38.

The holding table 32 has a holding surface 321 for holding the workpiece 2 of a workpiece unit 1 under suction thereon with the expandable sheet 3 interposed therebetween. The holding table 32 is shaped as a circular plate having a diameter smaller than the inside diameter of the annular frame 4. The holding table 32 includes a frame shaped as a circular plate made of metal such as stainless steel and an attracting member shaped as a circular plate made of a porous material such as porous ceramics and surrounded by the frame. The frame and the attracting member have respective upper surfaces lying flush with each other and provide the holding surface 321 for holding the workpiece 2 under suction. The attracting member is of substantially the same diameter as the workpiece 2.

The holding table 32 holds a workpiece unit 1 delivered by the second delivery unit 52, such that the reverse side 8 of the workpiece 2 is placed on the holding surface 321 with the expandable sheet 3 interposed therebetween. The attracting member of the holding surface 321 is connected to a suction unit 322 (see FIG. 11) such as a vacuum pump. When the attracting member of the holding surface 321 is evacuated by the suction unit 322, the reverse side 8 of the workpiece 2 is held under suction on the holding surface 321.

The frame securing assembly 31 functions to secure the annular frame 4 of a workpiece unit 1. The frame securing assembly 31 includes a frame rest plate 33 and a frame pressing plate 34. The frame rest plate 33 has an opening 331 defined therein that is circular in shape as viewed in plan and is of a plate shape having an upper surface 332 lying flatwise parallel to horizontal directions. The opening 331 defined in the frame rest plate 33 has a diameter equal to the inside diameter of the annular frame 4. The holding table 32 is disposed in the opening 331 in the frame rest plate 33, and the opening 331 is disposed coaxially with the holding table 32. The frame rest plate 33 has four centering guides 333 horizontally movably disposed respectively on the four corners of the upper surface 332. When the centering guides 333 are horizontally moved, the annular frame 4 of the workpiece unit 1 on the holding table 32 is adjusted in position to position the workpiece 2 into coaxial alignment with the attracting member of the holding surface 321 of the holding table 32.

The frame rest plate 33 can be lifted and lowered in the Z-axis directions by cylinders 35. Specifically, the frame rest plate 33 is mounted on upper distal ends of extendable and contractible rods 351 of the respective cylinders 35. When the rods 351 are extended and contracted, the frame rest plate 33 is lifted and lowered in the Z-axis directions.

The frame pressing plate 34 is shaped as a plate having substantially the same dimensions as the frame rest plate 33 and has a circular opening 341 defined centrally therein that is dimensionally identical to the opening 331. The frame pressing plate 34 is mounted on a distal end of an extendable and contractible piston rod 361 of a cylinder 36. When the piston rod 361 is extended and contracted in the Y-axis directions, the frame pressing plate 34 is movable between a position above the frame rest plate 33 and a retracted position away from the position above the frame rest plate 33. The frame pressing plate 34 has four oblong holes 342 defined respectively in four corners thereof. The centering guides 333 can each enter the respective oblong holes 342.

When the frame pressing plate 34 is positioned in the position retracted from the position above the frame rest plate 33 and the centering guides 333 are displaced away from each other, the annular frame 4 of a workpiece unit 1 delivered by the second delivery unit 52 is placed on the upper surface 332 of the frame rest plate 33. Then, the centering guides 333 are displaced closely toward each other, positioning the workpiece 2 of the workpiece unit 1. The frame pressing plate 34 is positioned above the frame rest plate 33, and the frame rest plate 33 is lifted by the cylinders 35, sandwiching and securing in position the annular frame 4 of the workpiece unit 1 between the frame rest plate 33 and the frame pressing plate 34.

The sheet expanding unit 37 relatively moves the holding table 32 and the frame securing assembly 31 to respective positions spaced from each other along an axis along the vertical directions to thereby expand the expandable sheet 3.

Figure 11:
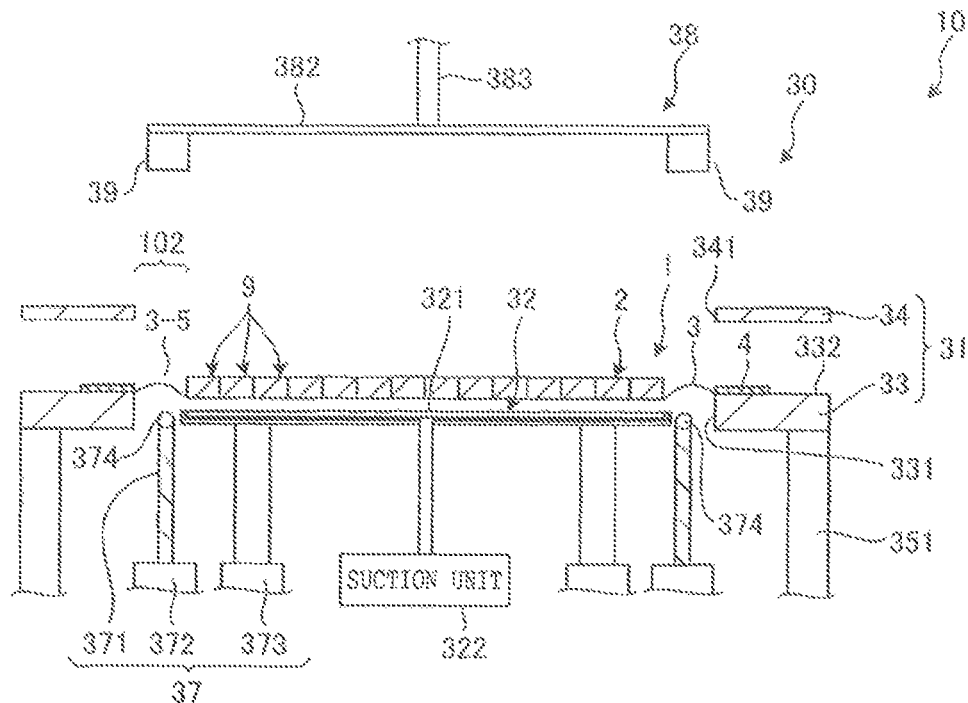
FIG. 11 is a cross-sectional view illustrating the manner in which the annular frame of the workpiece unit is placed on an upper surface of a frame rest plate of the heating unit in a second frame securing step of the expanding method illustrated in FIG. 6.

As illustrated in FIG. 11, the sheet expanding unit 37 includes a push-up member 371, a push-up member lifting and lowering unit 372, and a holding table lifting and lowering unit 373.

The push-up member 371 is shaped as a hollow cylinder having an outside diameter smaller than the inside diameter of the annular frame 4 placed on the upper surface 332 of the frame rest plate 33 and having an inside diameter larger than the diameters of the workpiece 2 affixed to the expandable sheet 3 and the holding table 32. The push-up member 371 is disposed coaxially with the holding table 32 that is disposed within the push-up member 371. Rollers 374 are rotatably mounted on the upper end of the push-up member 371.

The push-up member lifting and lowering unit 372 lifts and lowers the push-up member 371 in the Z-axis directions between a position in which the rollers 374 are positioned below the upper surface 332 of the frame rest plate 33 that is lowered and a position in which the rollers 374 are positioned below the upper surface 332 of the frame rest plate 33 that is lifted.

The holding table lifting and lowering unit 373 lifts and lowers the holding table 32 in the Z-axis directions between a position in which the holding surface 321 is positioned below the upper surface 332 of the frame rest plate 33 that is lowered and a position in which the holding surface 321 is positioned below the upper surface 332 of the frame rest plate 33 that is lifted.

The heating means 38 heats and shrinks the slackening portion 3-5, which is formed when the expandable sheet 3 is expanded by the expanding unit 20, in the annular region 102 of the expandable sheet 3 between the annular frame 4 and the workpiece 2. The heating means 38 includes a unit body 381 shaped as a circular plate and a plurality of heaters 39 mounted on the unit body 381.

The unit body 381 is disposed above the holding table 32 in coaxial alignment therewith. The unit body 381 is vertically movable by a rotary moving unit 382 as rotating means and is rotatable about the axis of a rotational shaft 383 extending parallel to the vertical directions. The rotational shaft 383 is of a cylindrical shape coaxial with the unit body 381.

The heaters 39 are angularly spaced at equal intervals circumferentially on an outer edge portion of the unit body 381 and are disposed on a circle aligned with the annular region 102 of the expandable sheet 3. The heaters 39 are disposed in respective positions vertically facing the annular region 102 of the expandable sheet 3 of the workpiece unit 1 held on the holding table 32 and the frame securing assembly 31. According to the present embodiment, the heaters 39 include four heaters disposed at equally spaced intervals along circumferential directions of the unit body 381. According to the present invention, however, the heaters 39 are not limited to the four heaters. The rotary moving unit 382 rotates the heaters 39 about the axis of the rotational shaft 383 aligned with the center of the circle on which the heaters 39 are disposed.

The heaters 39 are of the type that radiates infrared rays downwardly to heat the annular region 102 of the expandable sheet 3, e.g., infrared ceramic heaters that are heated to radiate infrared rays when a voltage is applied thereto. In a case where the heaters 39 are not to be distinguished from each other, they will simply be referred to as heaters 39. In a case where the heaters 39 are to be distinguished from each other, they will be referred to as a first heater 391, a second heater 392, a third heater 393, and a fourth heater 394. The heating means 38 thus include the first heater 391, the second heater 392, the third heater 393, and the fourth heater 394 that are disposed at equal angular intervals circumferentially.

A hypothetical line indicated by a dotted line in FIG. 5 and passing through the circumferential center of the first heater 391 and the center of the unit body 381 of the heating means 38 and a hypothetical line indicated by a dotted line in FIG. 5 and passing through the circumferential center of the second heater 392 and the center of the unit body 381 of the heating means 38 form an angle of 90 degrees therebetween. The hypothetical line passing through the circumferential center of the second heater 392 and the center of the unit body 381 of the heating means 38 and a hypothetical line indicated by a dotted line in FIG. 5 and passing through the circumferential center of the third heater 393 and the center of the unit body 381 of the heating means 38 form an angle of 90 degrees therebetween. The hypothetical line passing through the circumferential center of the third heater 393 and the center of the unit body 381 of the heating means 38 and a hypothetical line indicated by a dotted line in FIG. 5 and passing through the circumferential center of the fourth heater 394 and the center of the unit body 381 of the heating means 38 form an angle of 90 degrees therebetween. The hypothetical line passing through the circumferential center of the fourth heater 394 and the center of the unit body 381 of the heating means 38 and the hypothetical line passing through the circumferential center of the first heater 391 and the center of the unit body 381 of the heating means 38 form an angle of 90 degrees therebetween.

The cleaning unit 40 cleans mainly the workpiece 2 of a workpiece unit 1 whose expandable sheet 3 has been expanded by the expanding unit 20 and whose slackening portion 3-5 has been heated and shrunk by the heating unit 30. The cleaning unit 40 includes a spinner table 41 disposed below the pair of first guide rails 15, for holding the workpiece 2 of a workpiece unit 1 under suction thereon with the expandable sheet 3 interposed therebetween, and an unillustrated cleaning fluid supply nozzle for supplying a cleaning fluid to the face side 5 of the workpiece 2 that is held under suction on the spinner table 41.

When the first guide rails 15 are displaced away from each other, the workpiece unit 1 whose slackening portion 3-5 has been heated and shrunk by the heating unit 30 is placed onto the spinner table 41 of the cleaning unit 40 by the second delivery unit 52. While the spinner table 41 is rotating about its own central axis parallel to the Z-axis directions, the cleaning fluid supply nozzle supplies a cleaning fluid to the face side 5 of the workpiece 2, cleaning the workpiece 2.

The control unit 100 controls the components described above of the expanding apparatus 10, i.e., at least the heating means 38, etc., to enable the expanding apparatus 10 to process workpieces 2. The control unit 100 is a computer including an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the control unit 100 performs arithmetic processing operations according to computer programs stored in the storage apparatus and outputs control signals for controlling the expanding apparatus 10 through the input/output interface apparatus to the above components of the expanding apparatus 10.

The control unit 100 is connected to an unillustrated display unit such as a liquid crystal display apparatus for displaying processing states, images, etc., and an unillustrated input unit used by the operator to register processing contents information, etc. The input unit includes at least one of a touch panel on the display unit and external input apparatuses such as a keyboard.

Figure 6:
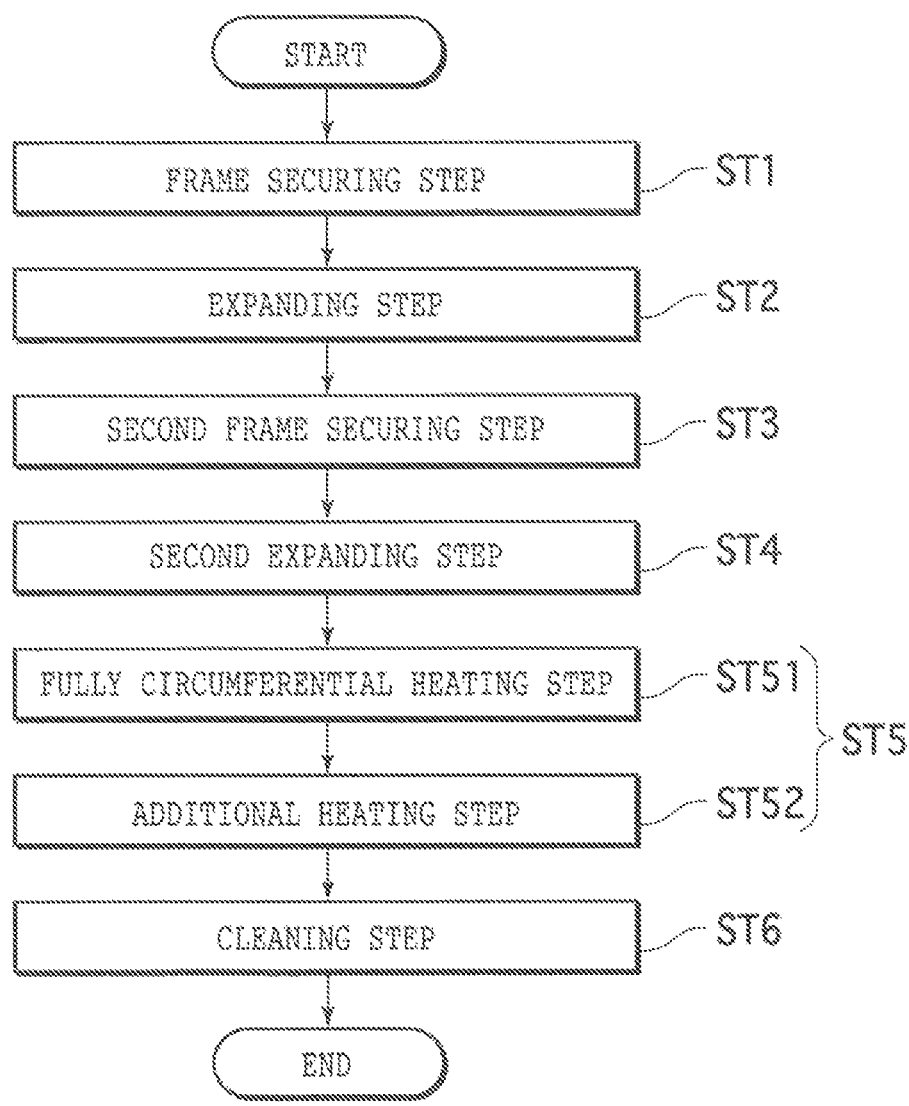
FIG. 6 is a flowchart of a sequence of an expanding method according to the embodiment.

An expanding method according to the present embodiment, which is typically carried out by the expanding apparatus 10, will be described below. FIG. 6 is a flowchart of a sequence of the expanding method according to the present embodiment. The expanding method according to the present embodiment is a method of expanding the expandable sheet 3 of a workpiece unit 1 to fracture the workpiece 2 thereof from the modified layers 101 as division initiating points, thereby dividing the workpiece 2 into individual device chips 9. As illustrated in FIG. 6, the expanding method includes a frame securing step ST1, an expanding step ST2, a second frame securing step ST3, a second expanding step ST4, a heating step ST5, and a cleaning step ST6.

(Frame Securing Step)

Figure 7:
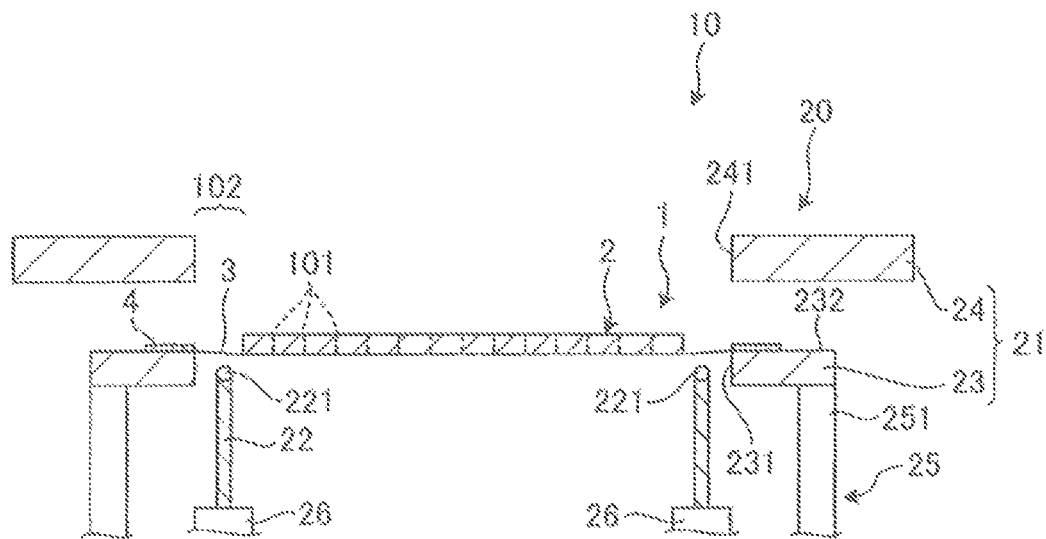
FIG. 7 is a cross-sectional view illustrating the manner in which an annular frame of a workpiece unit is placed on an upper surface of a frame rest plate of the expanding unit in a frame securing step of the expanding method illustrated in FIG. 6.
Figure 8:
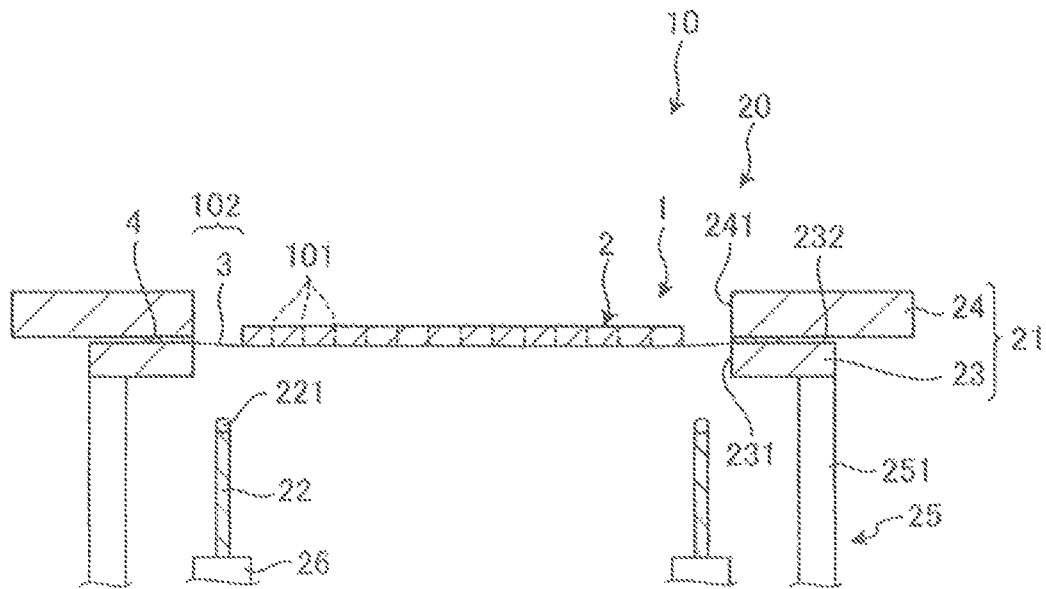
FIG. 8 is a cross-sectional view illustrating the manner in which a frame securing assembly of the expanding unit secures the annular frame of the workpiece unit in the frame securing step of the expanding method illustrated in FIG. 6.

FIG. 7 is a cross-sectional view illustrating the manner in which the annular frame of a workpiece unit is placed on the upper surface of the frame rest plate of the expanding unit in a frame securing step of the expanding method illustrated in FIG. 6. FIG. 8 is a cross-sectional view illustrating the manner in which the frame securing assembly of the expanding unit secures the annular frame of the workpiece unit in the frame securing step of the expanding method illustrated in FIG. 6.

The frame securing step ST1 is a step of securing the annular frame 4 of a workpiece unit 1 with the frame securing assembly 21 of the expanding unit 20. In the frame securing step ST1, the control unit 100 receives processing contents information via the input unit and stores the processing contents information in the storage apparatus, and the cassette 13 that houses a plurality of workpiece units 1 is placed on the cassette elevator 12. In the frame securing step ST1, when the control unit 100 receives a processing start instruction from the operator, while the expanding drum 22 of the expanding unit 20 is being lowered, the first delivery unit 51 takes one of the workpiece units 1 from the cassette 13 and temporarily places the workpiece unit 1 on the first guide rails 15, which are then moved closely toward each other to position the workpiece unit 1 in the X-axis directions.

In the frame securing step ST1, the second delivery unit 52 delivers the workpiece unit 1 from the first guide rails 15 onto the second guide rails 16, which are then moved closely toward each other to position the workpiece unit 1 in the X-axis directions. In the frame securing step ST1, as illustrated in FIG. 7, the third delivery unit 53 delivers the workpiece unit 1 from the second guide rails 16 onto the upper surface 232 of the frame rest plate 23, which has been lowered, of the expanding unit 20. In the frame securing step ST1, as illustrated in FIG. 8, the frame rest plate 23 of the expanding unit 20 is lifted to sandwich and secure the workpiece unit 1 between the frame pressing plate 24 and the frame rest plate 23.

(Expanding Step)

Figure 9:
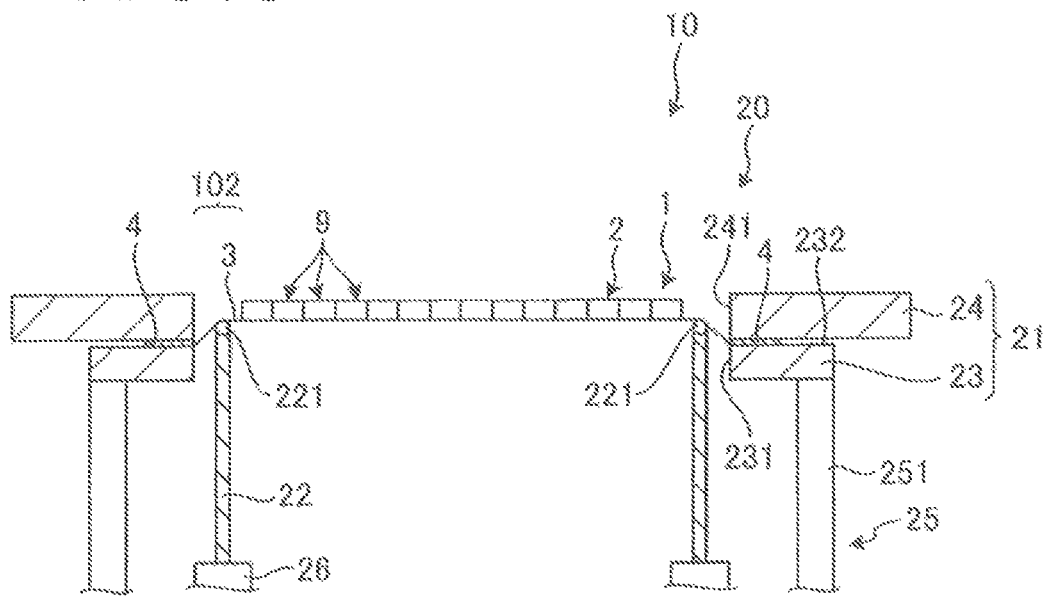
FIG. 9 is a cross-sectional view illustrating the manner in which an expanding drum of the expanding unit ascends to expand an expandable sheet in an expanding step of the expanding method illustrated in FIG. 6.
Figure 10:
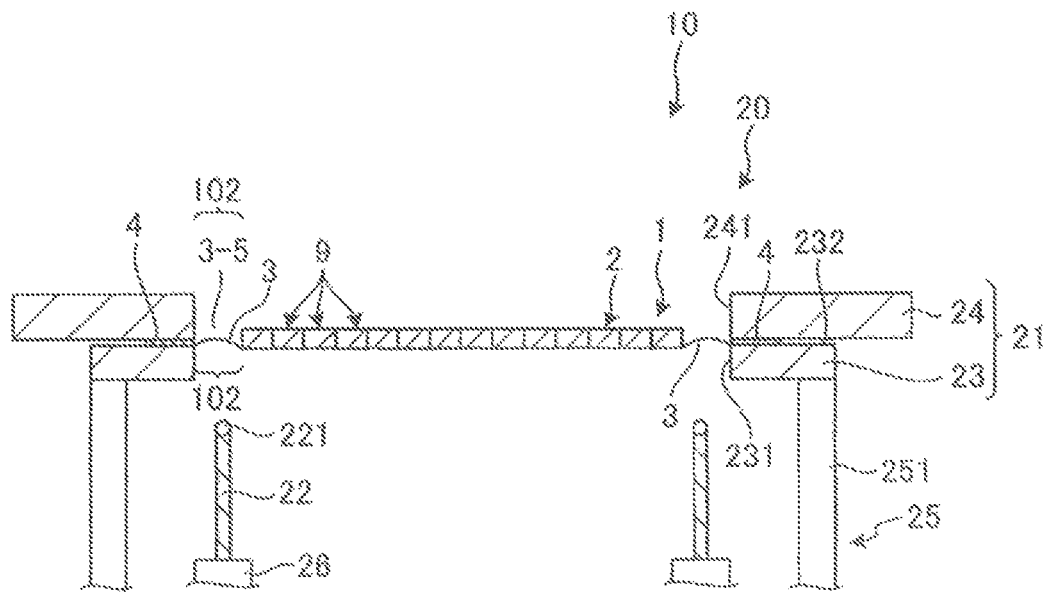
FIG. 10 is a cross-sectional view illustrating the manner in which the expanding drum descends after the expandable sheet has been expanded in the expanding step of the expanding method illustrated in FIG. 6.

FIG. 9 is a cross-sectional view illustrating the manner in which the expanding drum of the expanding unit ascends to expand the expandable sheet in an expanding step of the expanding method illustrated in FIG. 6. FIG. 10 is a cross-sectional view illustrating the manner in which the expanding drum descends after the expandable sheet has been expanded in the expanding step of the expanding method illustrated in FIG. 6.

The expanding step ST2 is a step of, after the frame securing step ST1 has been carried out, pressing the annular region 102 of the expandable sheet 3 between the outer circumferential edge of the workpiece 2 and the inner circumferential edge of the annular frame 4, with the expanding drum 22, to expand the expandable sheet 3. In the expanding step ST2, the expanding drum 22 is lifted to bring the rollers 221 provided on the upper end of the expanding drum 22 into contact with the annular region 102 of the expandable sheet 3 and cause the rollers 221 to press the expandable sheet 3 upwardly, thereby expanding the expandable sheet 3 in planar directions. In the sheet expanding step ST2, as the expandable sheet 3 is thus expanded, radial tensile forces act on the expandable sheet 3.

When radial tensile forces act on the expandable sheet 3 that is affixed to the reverse side 8 of the workpiece 2, since the modified layers 101 (see FIG. 8) have been formed in the workpiece 2 along the projected dicing lines 6, the workpiece 2 is divided from the modified layers 101 as division initiating points along the projected dicing lines 6 into individual device chips 9, as illustrated in FIG. 9. At the same time, the device chips 9 are spaced apart, with gaps formed therebetween. In the expanding step ST2, the expanding drum 22 of the expanding unit 20 is then lowered. Since the expandable sheet 3 has been expanded, a slackening portion 3-5 is formed in the annular region 102 of the expandable sheet 3, as illustrated in FIG. 10.

(Second Frame Securing Step)

Figure 12:
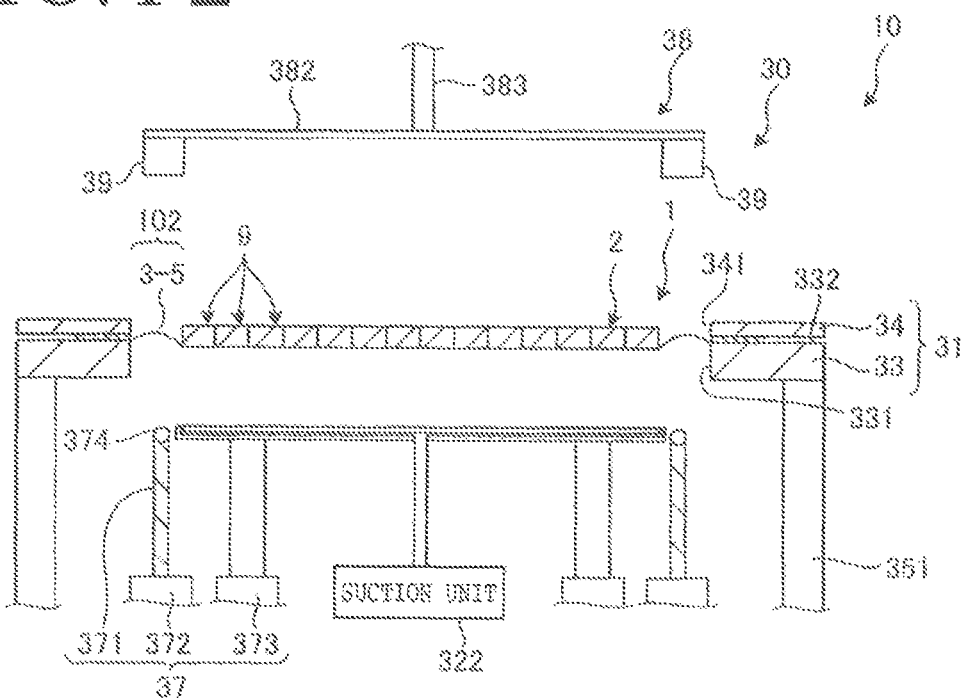
FIG. 12 is a cross-sectional view illustrating the manner in which a frame securing assembly of the heating unit secures the annular frame of the workpiece unit in the second frame securing step of the expanding method illustrated in FIG. 6.

FIG. 11 is a cross-sectional view illustrating the manner in which the annular frame of the workpiece unit is placed on the upper surface of the frame rest plate of the heating unit in a second frame securing step of the expanding method illustrated in FIG. 6. FIG. 12 is a cross-sectional view illustrating the manner in which a frame securing assembly of the heating unit secures the annular frame of the workpiece unit in the second frame securing step of the expanding method illustrated in FIG. 6.

The second frame securing step ST3 is a step of securing the annular frame 4 of the workpiece unit 1 with the frame securing assembly 21 of the heating unit 30. In the second frame securing step ST3, the frame rest plate 33 of the frame securing assembly 21 of the expanding unit 20 is lowered, and the third delivery unit 53 delivers the workpiece unit 1 from the frame rest plate 33 onto the second guide rails 16.

In the second frame securing step ST3, while the push-up member 371 and the holding table 32 of the heating unit 30 are being lowered and the frame pressing plate 34 of the frame securing assembly 31 is being positioned in the retracted position, the second delivery unit 52 delivers the workpiece unit 1 from the second guide rails 16 onto the upper surface 332 of the frame rest plate 33, as illustrated in FIG. 11.

In the second securing step ST3, the centering guides 333 of the frame securing assembly 31 are moved closely toward each other, positioning the workpiece 2 of the workpiece unit 1. In the second securing step ST3, the frame rest plate 33 is lifted to sandwich the annular frame 4 between the frame rest plate 33 and the frame pressing plate 34 to thereby secure the workpiece unit 1 in place, as illustrated in FIG. 12.

(Second Expanding Step)

Figure 13:
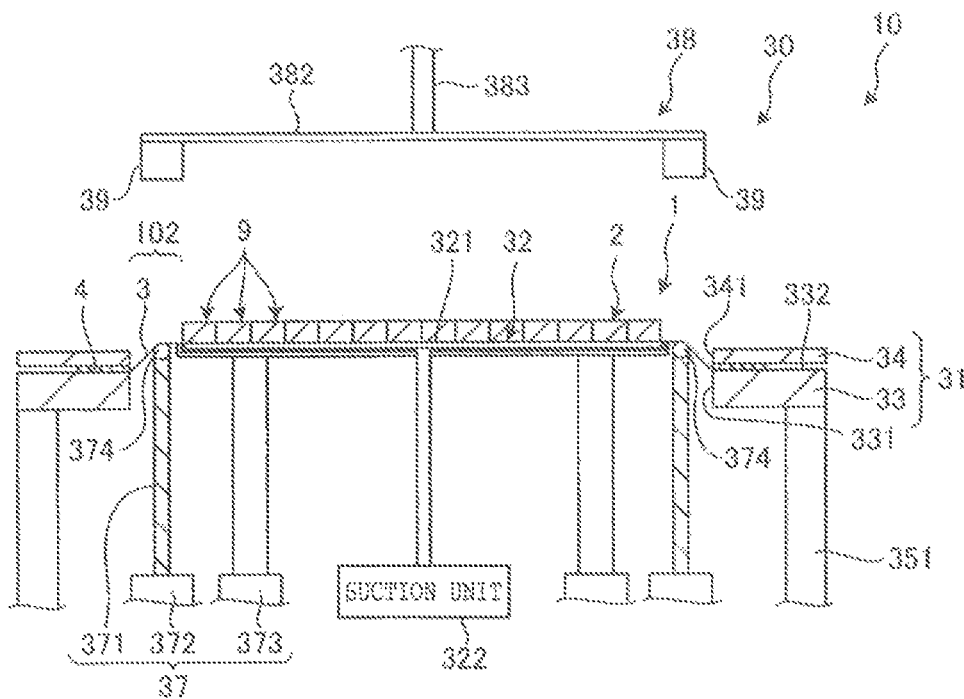
FIG. 13 is a cross-sectional view illustrating the manner in which a holding table holds the expandable sheet under suction after the expandable sheet has been expanded in the second expanding step of the expanding method illustrated in FIG. 6.

FIG. 13 is a cross-sectional view illustrating the manner in which the holding table holds the expandable sheet under suction after the expandable sheet has been expanded in the second expanding step of the expanding method illustrated in FIG. 6. The second expanding step ST4 is a step of pressing the annular region 102 of the expandable sheet 3 with the push-up member 371 to expand the expandable sheet 3 and holding the expandable sheet 3 under suction on the holding table 32 to keep the device chips 9 spaced apart from each other.

In the second expanding step ST4, the push-up member 371 and the holding table 32 of the heating unit 30 are lifted to stretch the annular region 102 of the expanded expandable sheet 3, forming gaps between the device chips 9, as illustrated in FIG. 13. In the second expanding step ST4, the suction unit 322 is actuated to evacuate the attracting member of the holding surface 321, thereby holding the reverse side 8 of the workpiece 2 under suction on the holding surface 321, keeping the device chips 9 spaced apart. In the second expanding step ST4, the push-up member 371 is lowered to a position below the upper surface 332 of the frame rest plate 33, and the holding table 32 is lowered to a position in which the holding surface 321 lies flush with the upper surface 332 of the frame rest plate 33. Then, a slackening portion 3-5 is formed in the annular region 102 of the expandable sheet 3.

(Heating Step)

The heating step ST5 is a step of, after the expanding step ST2 has been carried out, heating and shrinking the slackening portion 3-5 that has been formed in the annular region 102 upon the expansion of the expandable sheet 3. The heating step ST5 includes a fully circumferential heating step ST51 and an additional heating step ST52.

(Fully Circumferential Heating Step)

Figure 14:
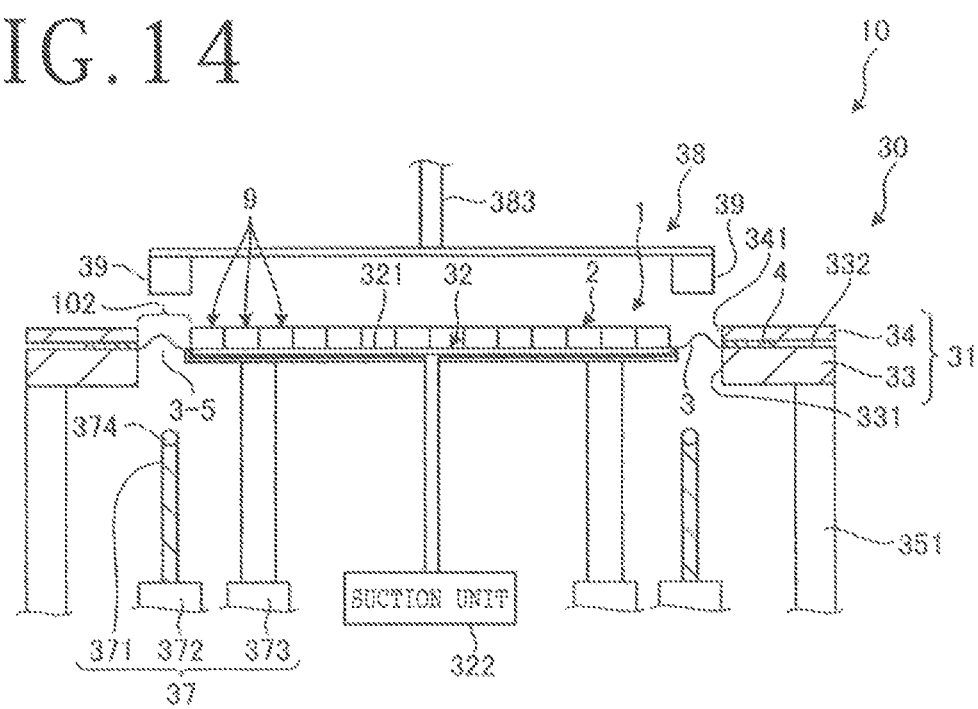
FIG. 14 is a cross-sectional view illustrating the manner in which a slackening portion of the expandable sheet is heated in a fully circumferential heating step of a heating step of the expanding method illustrated in FIG. 6.
Figure 15:
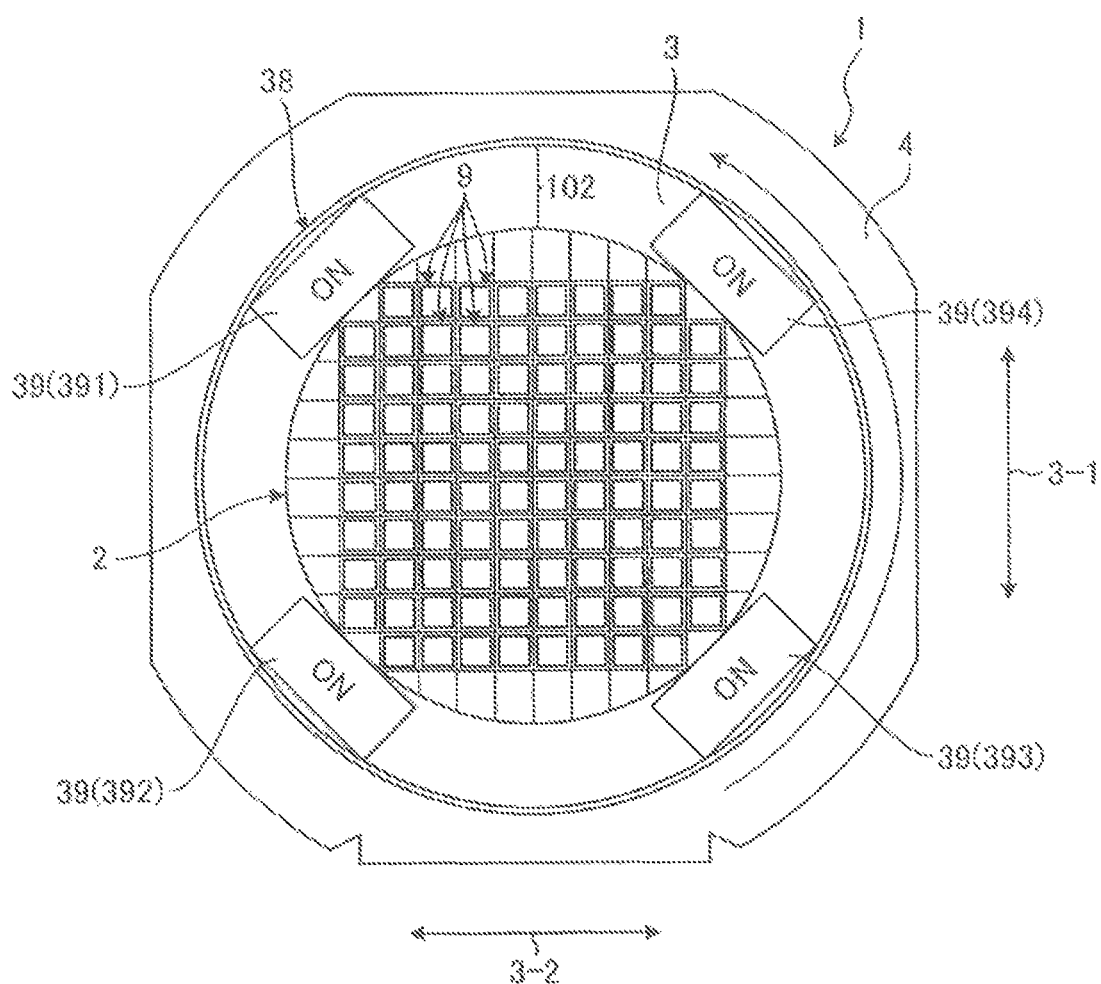
FIG. 15 is a plan view illustrating heaters of heating means for heating the slackening portion of the expandable sheet in the fully circumferential heating step of the heating step of the expanding method illustrated in FIG. 6.

FIG. 14 is a cross-sectional view illustrating the manner in which the slackening portion of the expandable sheet is heated in the fully circumferential heating step of the heating step of the expanding method illustrated in FIG. 6. FIG. 15 is a plan view illustrating the heaters of the heating means for heating the slackening portion of the expandable sheet in the fully circumferential heating step of the heating step of the expanding method illustrated in FIG. 6.

The fully circumferential heating step ST51 is a step of heating the full circumference of the slackening portion 3-5 of the annular region 102 around the workpiece 2, with the heating means 38. In the fully circumferential heating step ST51, the heating means 38 of the heating unit 30 is lowered as illustrated in FIG. 14. According to the present embodiment, as illustrated in FIG. 15, the first heater 391 faces an end portion of the annular region 102 in one of the first directions 3-1, which is also an end portion thereof in one of the second directions 3-2, the second heater 392 faces an end portion of the annular region 102 in the other of the first directions 3-1, which is also an end portion thereof in the one of the second directions 3-2, the third heater 393 faces an end portion of the annular region 102 in the other of the first directions 3-1, which is also an end portion thereof in the other of the second directions 3-2, and the fourth heater 394 faces an end portion of the annular region 102 in the one of the first directions 3-1, which is also an end portion thereof in the other of the second directions 3-2.

According to the present embodiment, in the fully circumferential heating step ST51, the heating unit 30 applies a voltage to all the heaters 391, 392, 393, and 394 of the heating means 38 to heat them to a predetermined temperature, causing the heaters 391, 392, 393, and 394 to radiate infrared rays, while, at the same time, the rotary moving unit 382 of the heating means 38 rotates the unit body 381 counterclockwise through 90 degrees. In the fully circumferential heating step ST51, therefore, the slackening portion 3-5 of the annular region 102 is heated and shrunk fully circumferentially by the infrared rays emitted from the heaters 391, 392, 393, and 394.

(Additional Heating Step)

Figure 16:
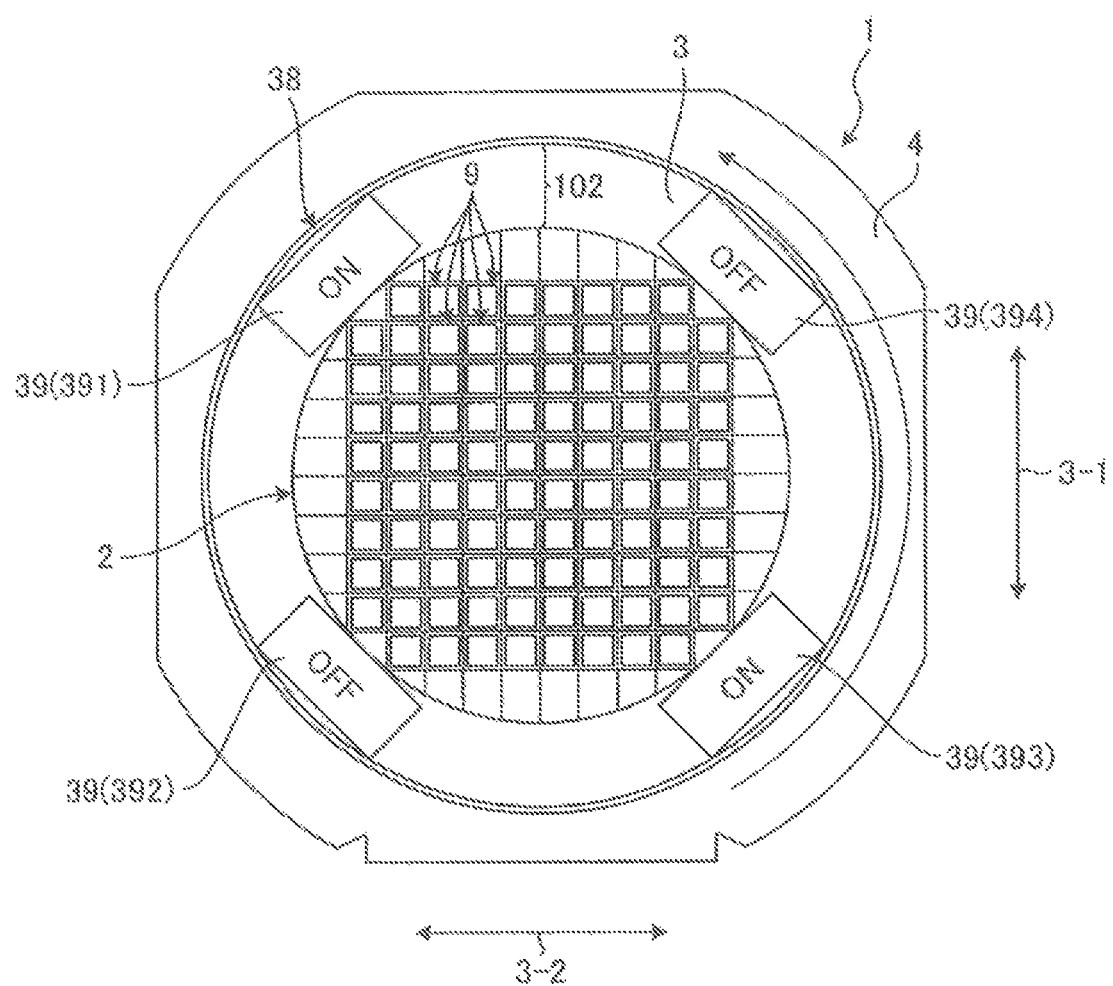
FIG. 16 is a plan view illustrating the heaters of the heating means at the time they start heating the slackening portion of the expandable sheet in an additional heating step of the heating step of the expanding method illustrated in FIG. 6.
Figure 17:
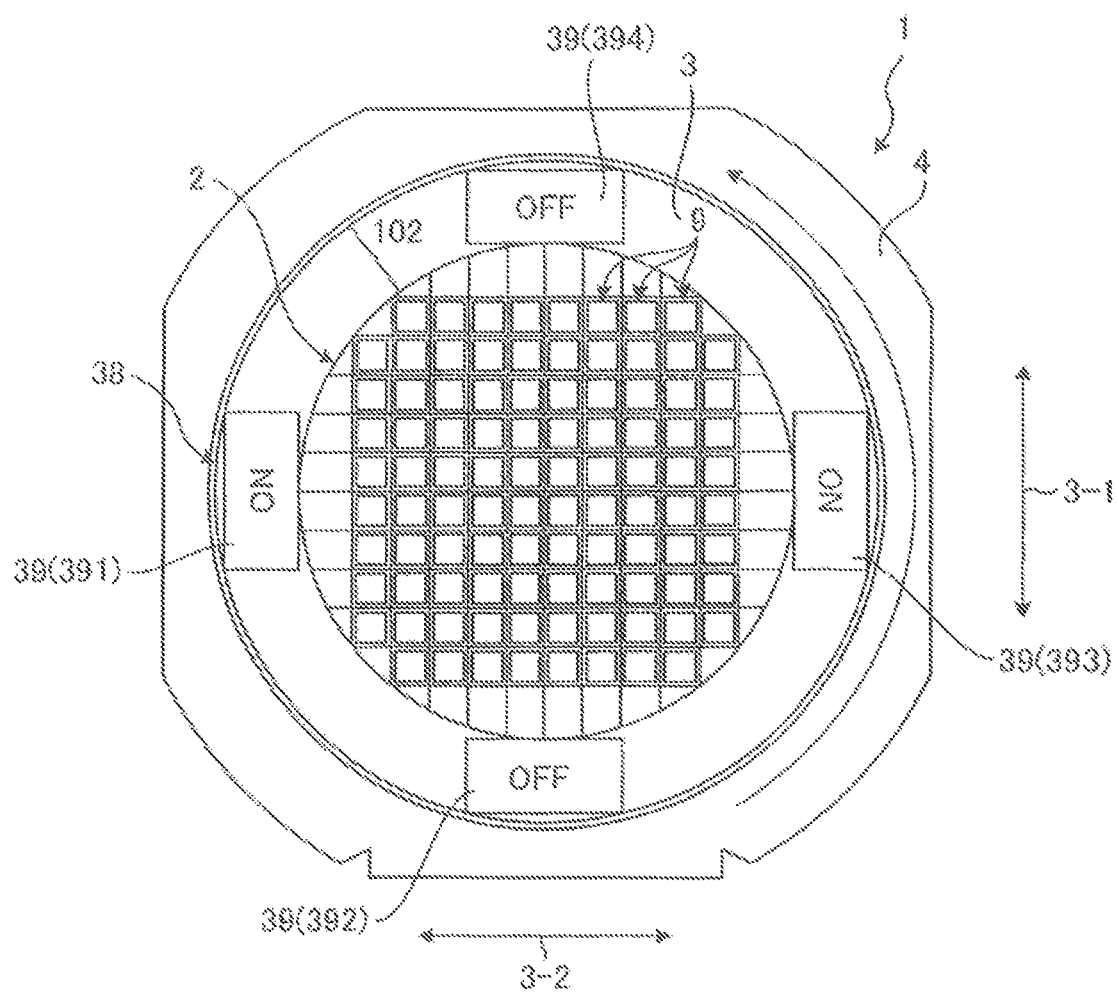
FIG. 17 is a plan view illustrating the heaters of the heating means while they are heating the slackening portion of the expandable sheet in the additional heating step of the heating step of the expanding method illustrated in FIG. 6.
Figure 18:
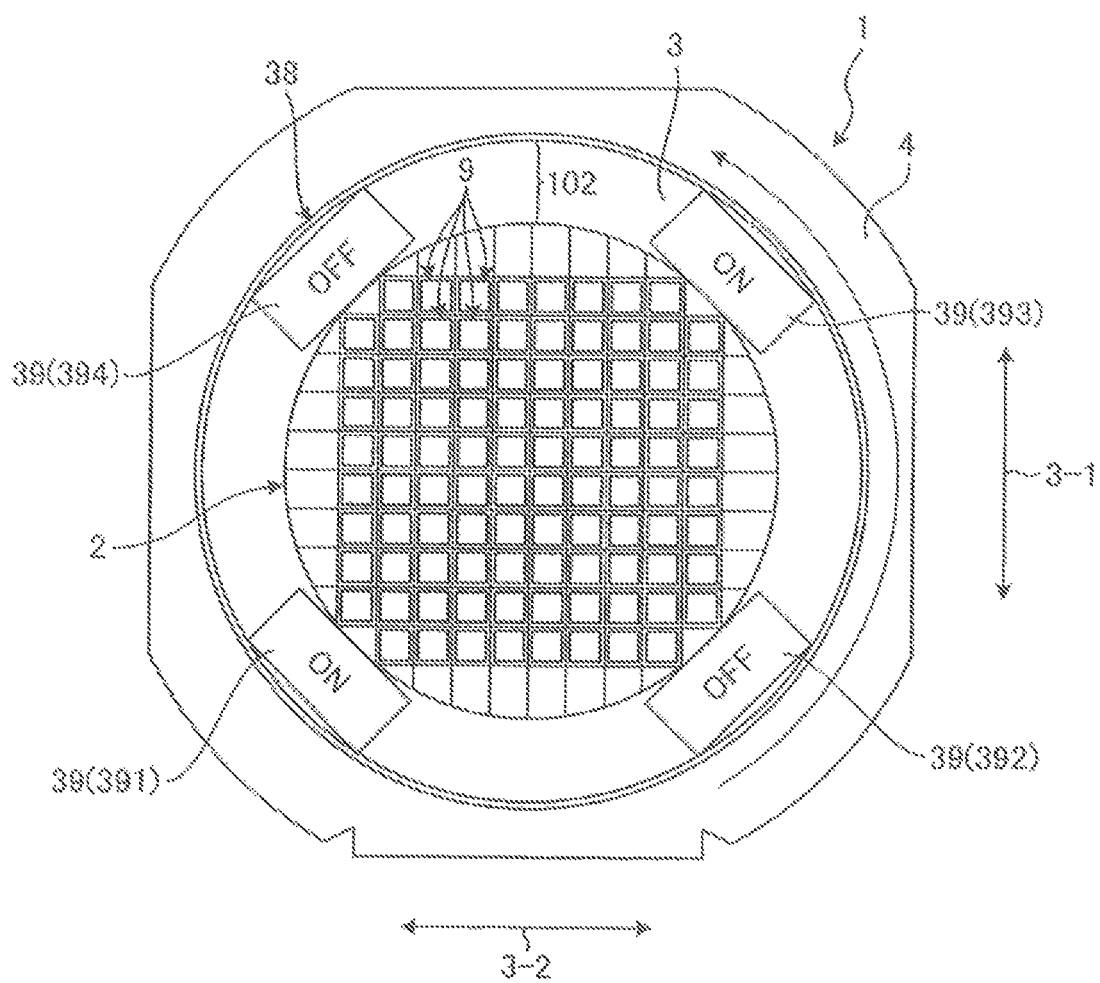
FIG. 18 is a plan view illustrating the heaters of the heating means at the time they finish heating the slackening portion of the expandable sheet in the additional heating step of the heating step of the expanding method illustrated in FIG. 6.

FIG. 16 is a plan view illustrating the heaters of the heating means at the time they start heating the slackening portion of the expandable sheet in an additional heating step of the heating step of the expanding method illustrated in FIG. 6. FIG. 17 is a plan view illustrating the heaters of the heating means while they are heating the slackening portion of the expandable sheet in the additional heating step of the heating step of the expanding method illustrated in FIG. 6. FIG. 18 is a plan view illustrating the heaters of the heating means at the time they finish heating the slackening portion of the expandable sheet in the additional heating step of the heating step of the expanding method illustrated in FIG. 6.

The additional heating step ST52 is a step of heating local areas of the slackening portion 3-5 of the annular region 102 around the workpiece 2, with the heating means 38. In the additional heating step ST52, after the fully circumferential heating step ST51, the rotary moving unit 382 of the heating means 38 of the heating unit 30 rotates the unit body 381 clockwise through 90 degrees. Then, according to the present embodiment, as illustrated in FIG. 16, the first heater 391 faces an end portion of the annular region 102 in one of the first directions 3-1, which is also an end portion thereof in one of the second directions 3-2, the second heater 392 faces an end portion of the annular region 102 in the other of the first directions 3-1, which is also an end portion thereof in the one of the second directions 3-2, the third heater 393 faces an end portion of the annular region 102 in the other of the first directions 3-1, which is also an end portion thereof in the other of the second directions 3-2, and the fourth heater 394 faces an end portion of the annular region 102 in the one of the first directions 3-1, which is also an end portion thereof in the other of the second directions 3-2.

According to the present embodiment, in the additional heating step ST52, the heating unit 30 applies a voltage to the first heater 391 and the third heater 393 of the heating means 38 to heat them to a predetermined temperature, but applies no voltage to the second heater 392 and the fourth heater 394, causing the first heater 391 and the third heater 393 to radiate infrared rays, while, at the same time, the rotary moving unit 382 of the heating means 38 rotates the unit body 381 counterclockwise through 90 degrees. As illustrated in FIG. 17, the first heater 391 and the third heater 393 face central portions of the annular region 102 in the first directions 3-1, which are also end portions thereof in the second directions 3-2, and thereafter, as illustrated in FIG. 18, the first heater 391 faces the end portion of the annular region 102 in the other of the first directions 3-1, which is also the end portion thereof in the one of the second directions 3-2, and the third heater 393 faces the end portion of the annular region 102 in the one of the first directions 3-1, which is also the end portion thereof in the other of the second directions 3-2.

In the additional heating step ST52, therefore, the heating means 38 heats and shrinks both end portions of the slackening portion 3-5 of the annular region 102 in the second directions 3-2, i.e., areas of the slackening portion 3-5 of the annular region 102 outside of the workpiece 2 in the second directions 3-2.

According to the present embodiment, in the additional heating step ST52, as illustrated in FIG. 17, the second heater 392 and the fourth heater 394 face central portions of the annular region 102 in the second directions 3-2, which are also both end portions thereof in the first directions 3-1, and thereafter, as illustrated in FIG. 18, the second heater 392 faces the end portion of the annular region 102 in the other of the first directions 3-1, which is also the end portion thereof in the other of the second directions 3-2. In the additional heating step ST52, therefore, while the rotary moving unit 382 is rotating the heaters 391, 392, 393, and 394, the control unit 100 stops the second heater 392 and the fourth heater 394, among the heaters 391, 392, 393, and 394, from heating the annular region 102 when they face both end portions of the annular region 102 in the first directions 3-1.

(Cleaning Step)

The cleaning step ST6 is a step of cleaning the workpiece 2 with the cleaning unit 40 after the heating step ST5 has been carried out. In the cleaning step ST6, the holding table 32 of the heating unit 30 stops holding the workpiece 2 under suction, after which the second delivery unit 52 delivers the workpiece unit 1 to the cleaning unit 40. In the cleaning step ST6, the cleaning unit 40 cleans the workpiece unit 1, and thereafter, the first delivery unit 51 places the cleaned workpiece unit 1 into the cassette 13. The expanding apparatus 10 successively expands the expandable sheets 3 of the workpiece units 1 stored in the cassette 13, dividing the workpieces 2 into individual device chips 9. When the expanding apparatus 10 has expanded the expandable sheets 3 of all the workpiece units 1 stored in the cassette 13, dividing the workpieces 2 into individual device chips 9, the expanding apparatus 10 finishes its processing operation.

As described above, the expanding method and the expanding apparatus 10 according to the present embodiment carry out, in addition to the fully circumferential heating step ST51, the additional heating step ST52 to heat both ends in the second directions 3-2 of the annular region 102 of the expandable sheet 3 that is less liable to shrink in the second directions 3-2 and to stop heating of both ends in the first directions 3-1 of the annular region 102 of the expandable sheet 3, so that the expandable sheet 3 is sufficiently shrunk in the second directions 3-2 along which the expandable sheet 3 is less liable to shrink. Consequently, enough gaps are formed between the device chips 9 regardless of the directions, i.e., in all directions, preventing adjacent ones of the device chips 9 from colliding and damaging each other. As a result, the expanding method and the expanding apparatus 10 according to the present embodiment are advantageous in that they are effective to restrain the divided device chips 9 from colliding and damaging each other.

The present invention is not limited to the above illustrated embodiment, and various changes and modifications may be made therein without departing from the scope of the invention. For example, the modified layers 101 are formed as division initiating points in the workpiece 2 in the embodiment. However, the present invention is not limited to such details. Instead, laser processed grooves or cut grooves may be formed as division initiating points in workpieces. According to the embodiment, the expanding apparatus 10 includes the expanding unit 20 and the heating unit 30. According to the present invention, however, a single unit having the functions of both the expanding unit 20 and the heating unit 30 may expand the expandable sheet 3 and heat and shrink the slackening portion 3-5.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An expanding method of expanding an expandable sheet of a workpiece unit that includes a workpiece, the expandable sheet affixed to the workpiece, and an annular frame to which an outer circumferential portion of the expandable sheet is affixed, the expanding method comprising the steps of:
   securing the annular frame of the workpiece unit with frame securing means in an expanding unit;
   after the step of securing the annular frame in the expanding unit, pressing a portion of the expandable sheet that lies between an outer circumferential edge of the workpiece and an inner circumferential edge of the annular frame, with pressing means to expand the expandable sheet, wherein the expandable sheet has a width extending in a first width direction and a length extending in a length direction, and when the expandable sheet is heated, an amount that the expandable sheet shrinks in the length direction is less than an amount that the expandable sheet shrinks in the width direction;
   securing the annular frame of the workpiece unit with frame securing means in a heating unit, wherein the expanding unit and the heating unit are different units;
   after the step of securing the annular frame in the heating unit, pressing an annular region of the expandable sheet that lies between the outer circumferential edge of the workpiece and the inner circumferential edge of the annular frame with pressing means to expand the expandable sheet; and
   after the step of pressing the annular region of the expandable sheet to expand the expandable sheet in the heating unit, heating and shrinking a slackening portion of the expandable sheet which has been formed by expansion of the expandable sheet,
   wherein the step of heating and shrinking the slackening portion of the expandable sheet including the steps of:
   heating a full outer circumferential portion of the workpiece by rotating a plurality of heaters relative to the slackening portion of the expandable sheet, and
   after heating the full outer circumferential portion of the workpiece, additionally heating a local area, which is a portion of the workpiece that is less than the full outer circumferential portion of the workpiece, by rotating a first heater of the plurality of heaters of the heating unit and stopping the first heater at a first rotational position relative to the workpiece, to face an end portion of the annular region in the width direction and simultaneously rotating and stopping a second heater of the plurality of heaters of the heating unit to face an end portion of the annular region in the lengthdirection, and to a second rotational position, by rotating and stopping the first heater to face end portions of the annular region in the width and length directions and simultaneously rotating and stopping the second heater to face end portions of the annular region in the width and length directions, wherein the first rotational position and the second rotational position are different.

2. The expanding method according to claim 1, wherein the expandable sheet of the workpiece unit is cut off from an expandable sheet web having a constant width,
   and
   the step of additionally heating the local area of the full outer circumferential portion of the workpiece includes the step of heating both areas of the slackening portion outside of the workpiece in the length directions.

3. The expanding method according to claim 1, wherein the step of additionally heating the local area of the full outer circumferential portion of the workpiece includes rotating a heating means relative to the local area of the full outer circumferential portion of the workpiece.

4. The expanding method according to claim 1, further comprising a cleaning step after the step of heating and shrinking the slackening portion of the expandable sheet, the cleaning step including cleaning the workpiece.

5. The expanding method according to claim 1, wherein the plurality of heaters include four heaters that are spaced from each other along the circumference of the workpiece.

6. An expanding method of expanding an expandable sheet of a workpiece unit that includes a workpiece, the expandable sheet affixed to the workpiece, and an annular frame to which an outer circumferential portion of the expandable sheet is affixed, the expanding method comprising the steps of:
  securing the annular frame of the workpiece unit with frame securing means;
  after the step of securing the annular frame, pressing a portion of the expandable sheet that lies between an outer circumferential edge of the workpiece and an inner circumferential edge of the annular frame, with pressing means to expand the expandable sheet, wherein the expandable sheet has a width extending in a width direction and a length extending in a length direction, and when the expandable sheet is heated, an amount that the expandable sheet shrinks in the length direction is less than an amount that the expandable sheet shrinks in the width direction; and
  after the step of pressing the portion of the expandable sheet to expand the expandable sheet, heating and shrinking a slackening portion of the expandable sheet which has been formed by expansion of the expandable sheet,
  wherein the step of heating and shrinking the slackening portion of the expandable sheet includes the steps of:
    heating a full outer circumferential portion of the workpiece, and
    after the step of heating the full outer circumferential portion of the workpiece, additionally heating a local area of the workpiece, which is a portion of the workpiece that is less than the full outer circumferential portion of the workpiece, by rotating and stopping a first heater of a plurality of heaters of the heating unit at a first rotational position relative to the workpiece, to face an end portion of the annular region in the width direction and simultaneously rotating and stopping a second heater of the plurality of heaters of the heating unit to face an end portion of the annular region in the length direction, and rotating and stopping the first heater at second rotational position, by rotating and stopping the first heater to face end portions of the annular region in the width and length directions and simultaneously rotating and stopping the second heater to face end portions of the annular region in the width and length directions, wherein the first rotational position and the second rotational position are different.

7. The expanding method according to claim 6, wherein the expandable sheet of the workpiece unit is cut off from an expandable sheet web having a constant width,
and
the step of additionally heating the local area of the full outer circumferential portion of the workpiece includes the step of heating both areas of the slackening portion outside of the workpiece in the length directions.

* * * * *